US006566907B1

(12) United States Patent
Nguyen

(10) Patent No.: US 6,566,907 B1
(45) Date of Patent: May 20, 2003

(54) UNCLOCKED DIGITAL SEQUENCER CIRCUIT WITH FLEXIBLY ORDERED OUTPUT SIGNAL EDGES

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 35 days.

(21) Appl. No.: 10/007,285

(22) Filed: Nov. 8, 2001

(51) Int. Cl.⁷ ............................................. H03K 19/00
(52) U.S. Cl. ......................... 326/46; 326/93; 327/15
(58) Field of Search .................... 326/46, 93–98; 327/13–16

(56) References Cited

U.S. PATENT DOCUMENTS

| | | | | |
|---|---|---|---|---|
| 5,233,617 A | * | 8/1993 | Simmons et al. | 714/814 |
| 5,304,855 A | * | 4/1994 | Naufel | 327/31 |
| 5,646,519 A | * | 7/1997 | Hamilton et al. | 324/76.82 |
| 5,729,169 A | * | 3/1998 | Roohparvar | 327/227 |

* cited by examiner

*Primary Examiner*—Don Le
(74) *Attorney, Agent, or Firm*—Lois D. Carter

(57) ABSTRACT

An unclocked, digital sequencer circuit having flexibly ordered leading and trailing edges on the output signals. The sequencer circuit of the invention includes a dual-input latch that detects only leading edges on a first input terminal and only trailing edges on a second input terminal. A delay line provides successively delayed input signals. Two delayed input signals are coupled to the first and second input terminals of each of two or more dual-input latches that provide a set of sequencer output signals. The sequence of the output signal edges depends on which delayed input signals are selected to drive each dual-input latch. In one embodiment, the selection of delayed input signals to drive the first and second input terminals of the dual-input latches is programmable. Thus, the sequence of the leading edges on the output signals is programmable, and the sequence of the trailing edges is independently programmable.

30 Claims, 9 Drawing Sheets

UNCLOCKED DIGITAL SEQUENCER CIRCUIT WITH FLEXIBLY ORDERED OUTPUT SIGNAL EDGES

FIELD OF THE INVENTION

The invention relates to digital signal sequencing circuits. More particularly, the invention relates to an unclocked digital signal sequencer having flexibly ordered output signal edges.

BACKGROUND OF THE INVENTION

As integrated circuits (ICs) evolve, operating speeds are continually increasing. Therefore, the amount of time available for exchanging data between different ICs is growing ever shorter. In order to achieve a robust IC, circuit designers must take into account the following issues.

Firstly, race conditions sometimes occur, where two or more signals are "racing" to arrive at a common destination, e.g., the input terminals of a given circuit. The destination circuit may be designed under the assumption that the signals will arrive at the input terminals of the circuit in a certain order. (While this design technique is preferably avoided, sometimes allowing a race condition can improve the overall performance of the circuit.) However, under some manufacturing or operating conditions, the supposedly "slower" signal can actually win the race, i.e., arrive prior to the supposedly "faster" signal. Some of these conditions include extreme processing corners, temperatures, and power high voltage values. When such a signal reversal occurs, a temporary glitch can appear in an internal signal or an output signal of the circuit. When the circuit is a state machine, for example, a signal glitch can send the entire state machine into a wrong state.

Secondly, sometimes pulses or edges on control signals must occur in a particular order for a circuit to function properly. For example, consider a circuit that exchanges data stored in blocks A and B. First, the data from block A is latched in a temporary latch. Second, the data from block B is stored in block A. Third, the data from the temporary latch is stored in block B. These three steps must occur in this precise order, or data is lost. This order may be ensured, for example, by providing three enable signals that can only occur in the proper order.

A clock signal is often used to ensure that signals become active in a particular sequence. For example, FIG. 1A shows a simple sequencer circuit that uses a clock to produce three sequential signals that can be used as sequential enable signals. Sequencer circuit 100 includes three flip-flops 101–103 connected in series and having outputs A1–A3, respectively. The flip-flops are reset by a reset signal RST and clocked by a clock signal CK. The input DIN to the first flip-flop in the series (101) is created by ANDing (in AND-gate 111) an enable signal EN with the inverted output of flip-flop 101, inverted by inverter 112.

FIG. 1B is a timing diagram for sequencer circuit 100 of FIG. 1A. While reset signal RST is high, the three flip-flops are reset and the three flip-flop output signals are all held low. When reset signal RST is low and enable signal EN goes high, input signal DIN goes high (time T1). On the next rising edge of clock signal CK (time T2), the output signal A1 of the first flip-flop 101 goes high. Signal A1 feeds back through inverter 112 and AND-gate 111 and flip-flop input signal DIN goes low. At the next rising edge of clock signal CK (time T3), flip-flop output signal A1 goes low in response to the low value on signal DIN, while flip-flop output signal A2 goes high. At the next rising edge of clock signal CK (time T4), flip-flop output signal A2 goes low and flip-flop output signal A3 goes high. At the next rising edge of clock signal CK (time T5), flip-flop output signal A3 goes low.

While quite reliable, clock sequencer circuit 100 of FIG. 1A cannot be used for all circuits and applications. The delay between sequencer output signals A1–A3 is necessarily limited by the speed of the available clock signal CK, which can materially slow the operation of the circuit controlled by the sequencer output signals. Also, at times there is no reliable clock signal available, for example, during an IC power up sequence. An IC power up sequence includes many steps that must be performed in a predetermined sequence. However, during the earlier steps the power high level can be below that required for generating a reliable clock.

This situation can be exacerbated in a programmable logic device, where clock signals are generally routed using programmable routing resources. These programmable routing resources cannot route a clock signal until the power ramps up sufficiently to reliably configure the device. Therefore, a programmable logic device might have to provide a separate and non-programmable clock signal to control the power-up sequence.

Even in non-programmable devices, if a clock is used to control the power-up sequence additional loading is added to the clock circuitry. Because clock speed is frequently a gating item in IC design, additional loading of the clock signals is to be avoided.

Additionally, the various circuits in a device are preferably powered up at the same time. If a clocked sequencing circuit is used to control the power up sequence, the skew on the clock signal between the various circuits must be taken into account and preferably neutralized.

Therefore, unclocked sequencing circuits are sometimes used, e.g., for controlling power up sequences. FIG. 2A shows a known unclocked sequencing circuit.

Sequencing circuit 200 is a simple delay chain that includes five inverters 201–205 coupled in series. The output of the first inverter 201 provides output signal B1. The output of the third inverter 203 provides output signal B2. The output of the fifth inverter 205 provides output signal B3.

FIG. 2B is a timing diagram for sequencer circuit 200 of FIG. 2A. There are two inverters between each pair of output signals, so when input signal IN goes low, each of output signals B1–B3 goes high in turn. The sequence of the rising edges on signals B1–B3 is guaranteed.

However, there are some drawbacks to this circuit as well. As is clearly shown in FIG. 2B, the output signals occur in a set order, and with set delays between the output signals.

FIG. 3A shows a third known sequencer circuit 300 that uses inverters with different trip points to generate output signals at various points of a changing edge of an input signal. By using three inverters with different triggering voltage levels, a slow input signal SIN is detected at three different points in the leading edge of the input signal. These three different points determine the sequence in which the output signals change state.

Sequencer circuit 300 includes inverters 301, 311–313, and TP1–TP3. Input signal IN is inverted by slow inverter 301 to provide slow input signal SIN. Slow input signal SIN is monitored by inverters TP1–TP3, each of which trips at a different point on the leading edge of a pulse in slow input signal SIN. The outputs of inverters TP1–TP3 are optionally inverted by inverters 311–313, respectively, to provide sequential output signals C1–C3.

FIG. 3B is a timing diagram for sequencer circuit 300 of FIG. 3A. When input signal IN goes low, slow inverter 301 starts to change state. Gradually, slow input signal SIN rises. At time t1, inverter TP1 is tripped, causing output signal C1 to go high. At time t2, slow input signal SIN has risen to the point where inverter TP2 is tripped, and output signal C2 goes high. Similarly, at time t3, inverter TP3 is tripped and output signal C3 goes high.

When input signal IN goes high again, slow input signal SIN gradually falls. As signal SIN falls back past the trip points of the three inverters TP1–TP3, their respective output signals return to the low state in reverse sequence.

A limitation to prior art unclocked sequencer circuits, including those shown in FIGS. 2A and 3A, is that gates in the circuit must be carefully sized, while processing, operating temperature, and the power high level must all be carefully controlled for the circuits to function predictably. If changes are made in any of these factors, or in the circuits controlled by a sequencing circuit (e.g., altering the loading of the sequencer output signals), then the sequencer circuit must be resimulated. Often, changes must be made to adapt the circuit to the new conditions.

A limitation common to all of the sequencing circuits previously described is that the order of the trailing edges on the output signals is fixed. For example, in the circuits of FIGS. 1A and 2A, the order of the trailing edges is always the same as the order of the leading edges. In the circuit of FIG. 3A, the order of the trailing edges is the reverse of the order of the leading edges. A sequencing circuit would be much more flexible if the leading and trailing edges of the output signals could occur independently and in any order. For example, given that capability, events controlled by the sequencer output signals could be made either completely sequential or concurrent (overlapping).

It is desirable to provide a sequencer circuit that addresses one or more of the limitations described above.

SUMMARY OF THE INVENTION

The invention provides an unclocked, digital sequencer circuit having flexibly ordered leading and trailing edges on the output signals. The sequencer circuit of the invention includes a dual-input latch that detects only leading edges on a first input terminal and only trailing edges on a second input terminal. A third input terminal provides a triggering input signal. When the triggering input signal is in one state (e.g., low), all trailing edges are ignored. When the triggering input signal changes state (e.g., goes high), the next leading edge (e.g., the next high edge) on the first input terminal is detected and changes the state of the dual-input latch. The next trailing edge (e.g., the next falling edge) on the second input terminal is then detected and returns the dual-input latch to its previous state.

One embodiment of the invention also includes a delay line, e.g., a series of inverters coupled in series. The triggering input signal drives the first inverter, while alternating inverters in the series (e.g., the second, fourth, and sixth inverters) provide successively delayed input signals. Two of these delayed input signals are coupled to the first and second input terminals of each of two or more dual-input latches. The output terminals of the dual-input latches provide a set of sequencer output signals. The order of the output signal edges depends on which delayed input signals are selected to drive each dual-input latch. The order of the leading edges can be made different from the order of the trailing edges simply by using appropriately delayed input signals to drive the first and second terminals of the dual-input latches.

Some embodiments of the invention use high pulses on the input and output signals. In other words, a leading edge is detected when the input signal transitions from low to high, and a trailing edge is detected when the input signal transitions from high to low. In one such embodiment, the dual-input latch is implemented using three NAND gates. Two of the NAND gates are cross-coupled. Of these two NAND gates, a first NAND gate provides the sequencer output signal and is also driven by a third NAND gate NANDing the triggering input signal with a signal from the first input terminal. The second cross-coupled NAND gate is also driven by a signal from the second input terminal. In other embodiments, other implementations of the dual-input latch are used to detect and generate high pulses.

Other embodiments of the invention use low pulses on the input and output signals. In other words, a leading edge is detected when the input signal transitions from high to low, and a trailing edge is detected when the input signal transitions from low to high. In one such embodiment, a dual-input latch is implemented using NOR gates. The latch is otherwise similar to the NAND gate latch described above. In other embodiments, other implementations of the dual-input latch are used to detect and generate low pulses.

In one embodiment, the selection of delayed input signals applied to the first and second input terminals of the dual-input latches is programmable. Thus, the sequence of the output signals is programmable. Further, the sequence of the leading edges is programmable, and the sequence of the trailing edges is independently programmable. This embodiment is particularly applicable to programmable logic devices, but is not limited thereto.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 1A:
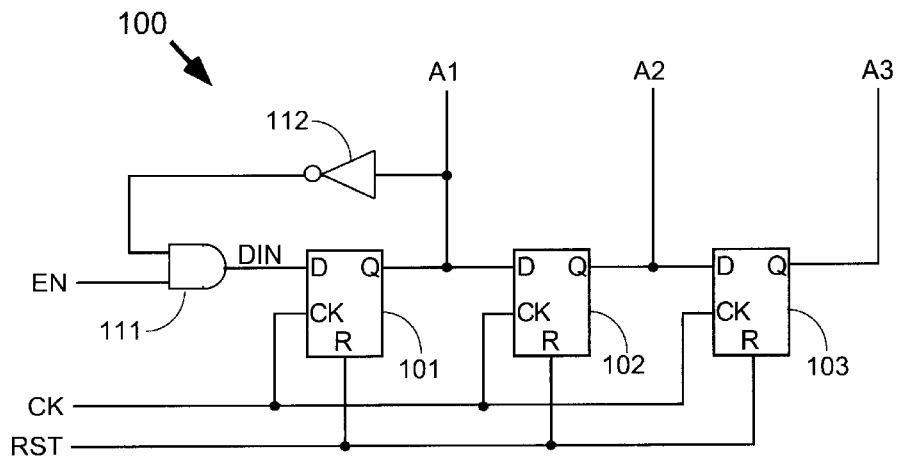
FIG. 1A is a block diagram of a first known sequencing circuit that uses a clock to order output signals.
Figure 1B:
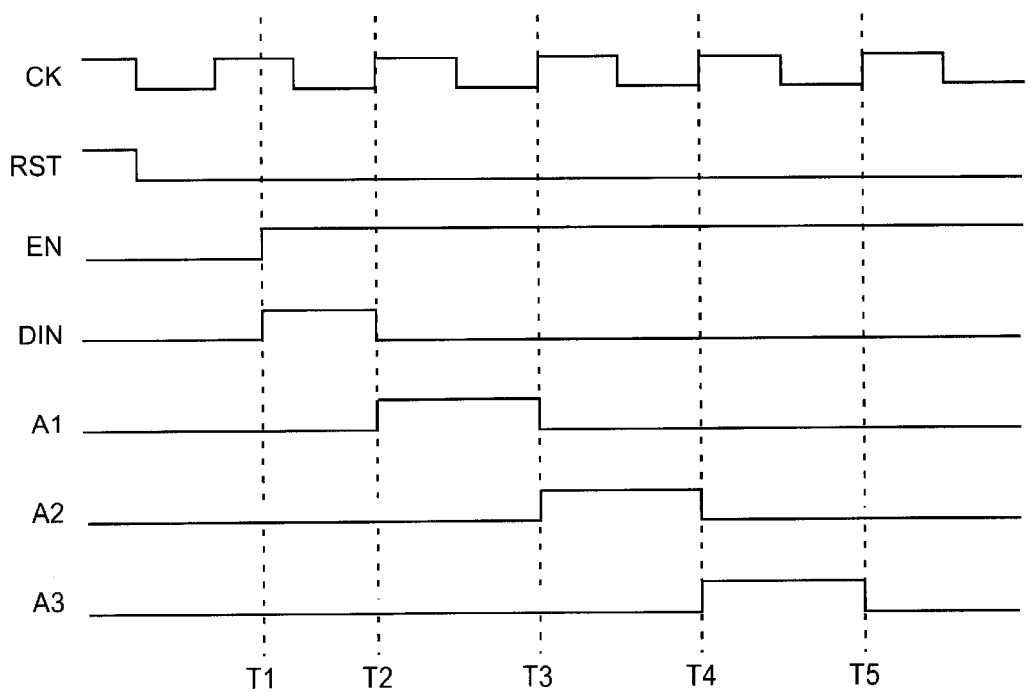
FIG. 1B is a timing diagram for the sequencing circuit of FIG. 1A.
Figure 2A:
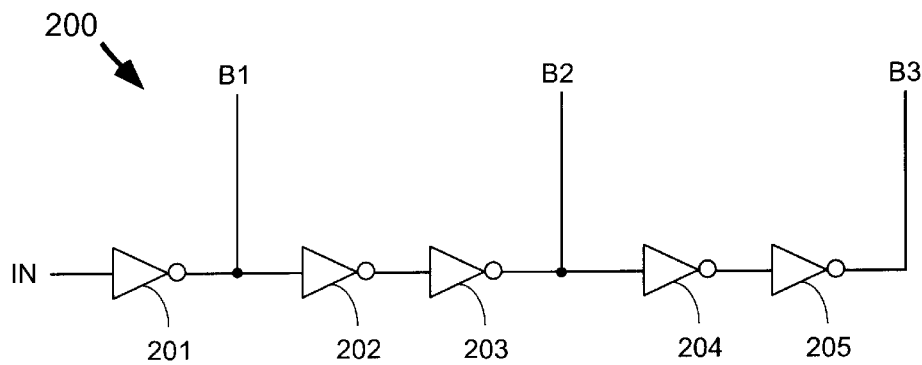
FIG. 2A is a block diagram of a second known sequencing circuit that does not require a clock.
Figure 2B:
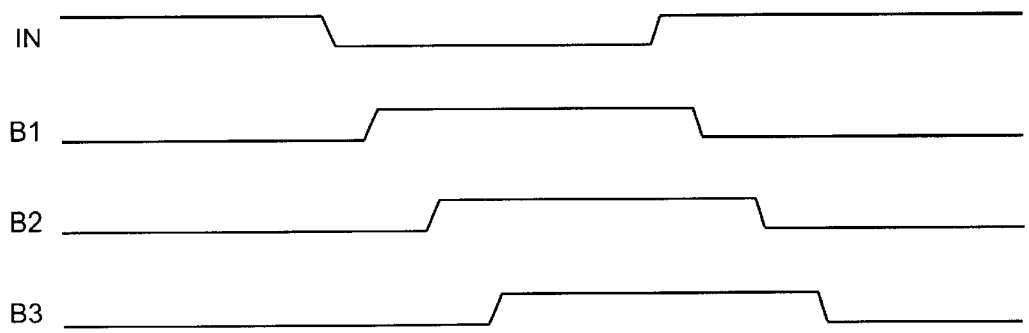
FIG. 2B is a timing diagram for the sequencing circuit of FIG. 2A.
Figure 3A:
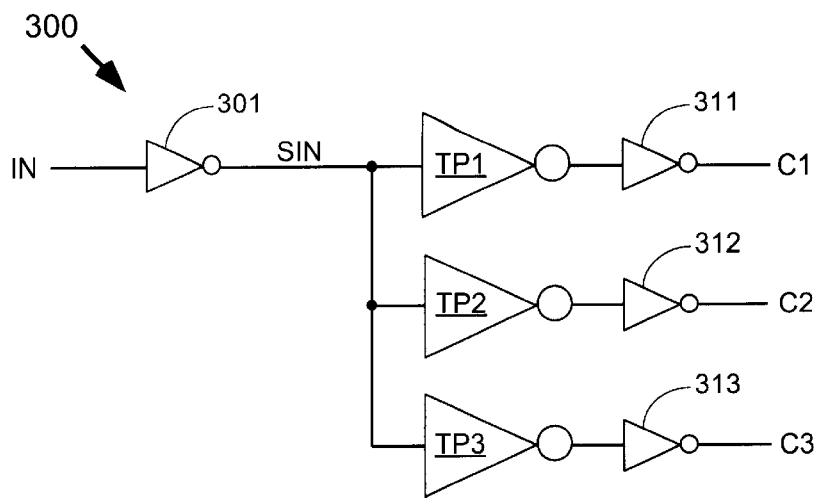
FIG. 3A is a block diagram of a third known sequencing circuit that uses inverters having different trip points to order output signals.
Figure 3B:
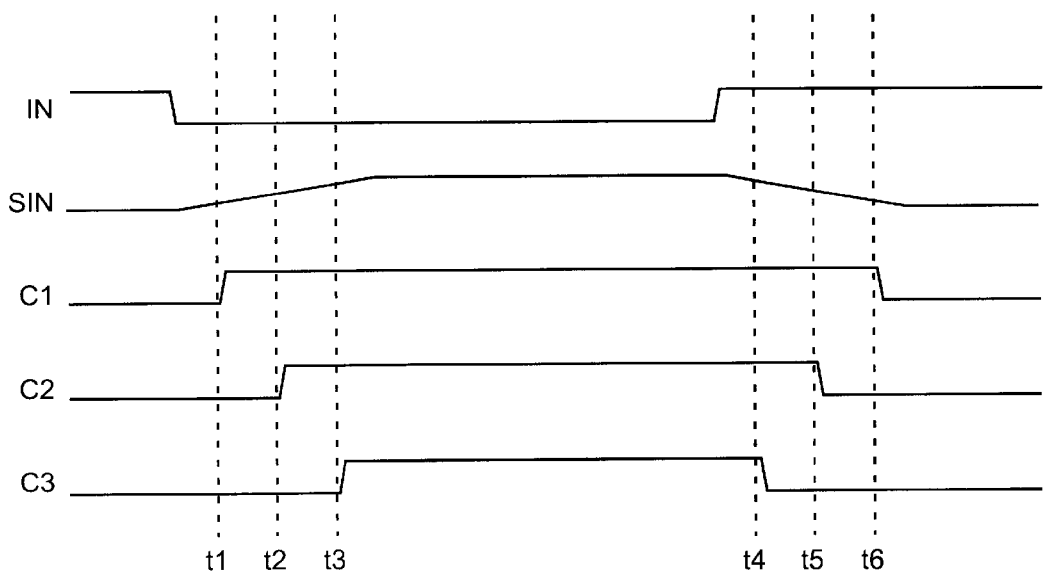
FIG. 3B is a timing diagram for the sequencing circuit of FIG. 3A.
Figure 4A:
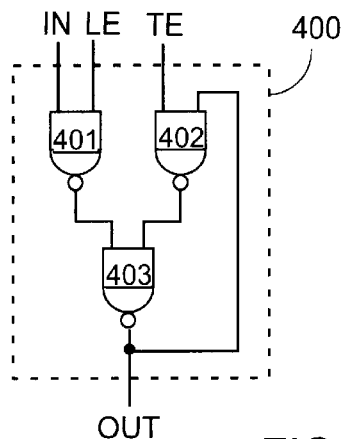
FIG. 4A is a circuit diagram of a first dual-input latch according to one embodiment of the invention.

FIG. 4A shows a dual-input latch 400 used with some embodiments of the invention. Dual-input latch 400 comprises three NAND gates. Two NAND gates (402 and 403) are cross-coupled. The second input of NAND gate 403 comes from NAND gate 401, which combines two input signals IN and LE. (In the present specification, the same reference characters are used to refer to terminals, signal lines, and their corresponding signals.) The second input of NAND gate 402 is a second input to the latch, called TE.

The signal name LE stands for "leading edge", because the latch only detects leading edges on this input signal. In the embodiment of FIG. 4A, input pulses are high pulses, so leading edges are rising edges. The signal name TE stands for "trailing edge", because the latch only detects trailing edges on this signal. In this embodiment, trailing edges are falling edges.

Figure 4B:
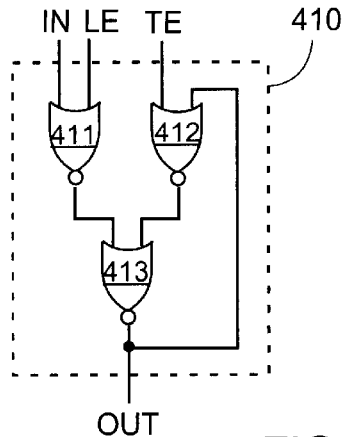
FIG. 4B is a circuit diagram of a second dual-input latch according to another embodiment of the invention.

FIG. 4B shows a second dual-input latch 410 that can be used with other embodiments of the invention. Dual-input latch 410 is used when input pulses are low pulses, i.e., leading edges are falling edges and trailing edges are rising edges. Dual-input latch 410 is similar to dual-input latch 400, except that NAND gates 401–403 are replaced with NOR gates 411–413, respectively.

Figure 4C:
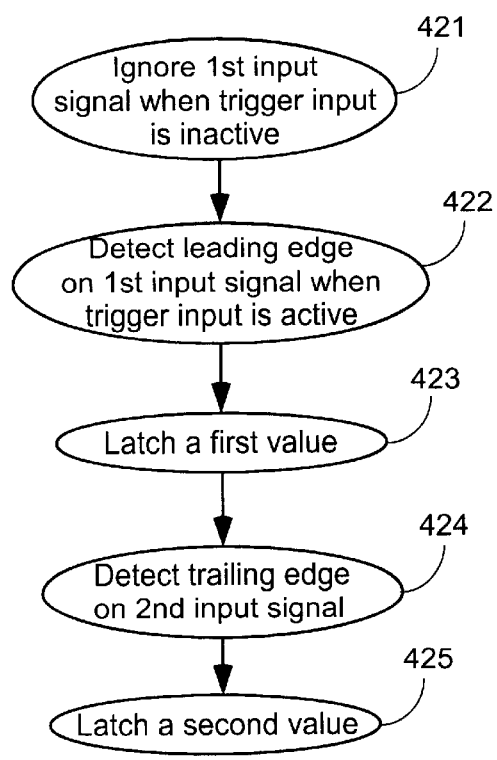
FIG. 4C is a flow chart demonstrating the functions performed by the dual-input latch of the invention.

The dual-input latches of FIGS. 4A and 4B function as shown in FIG. 4C. As shown in step 421, as long as trigger input signal IN is inactive (e.g., low for latch 400, high for latch 410), any leading edge on input signal LE is ignored. In step 422, a leading edge is detected on input signal LE when signal IN is active. In response, a first value is latched into the dual-input latch (step 423). In step 424, a trailing edge is detected on input signal TE. In response, a second value is latched into the dual-input latch (step 425).

In summary, when enabled by signal IN, a leading edge on a first signal LE causes the output of the latch to change state. A trailing edge on a second signal TE then returns the latch to its previous value.

As can be seen from the embodiments of FIGS. 4A and 4B, the state of trigger input signal IN is not relevant to the detection of a trailing edge. Therefore, if the pulse on trigger input signal IN goes away prior to the detection of a trailing edge, the circuit still functions as desired.

Figure 5A:
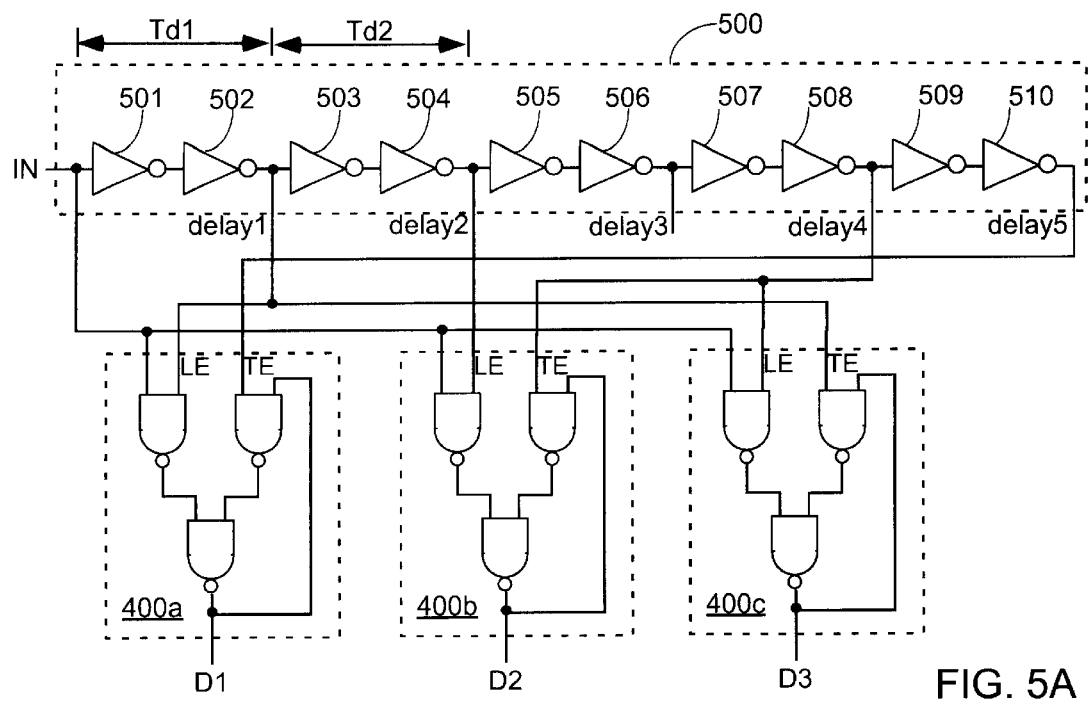
FIG. 5A is a circuit diagram of a digital sequencer circuit according to one embodiment of the invention.

FIG. 5A shows a digital sequencer circuit according to one embodiment of the invention. The sequencer circuit includes a delay line 500, three dual-input latches 400a–400c, and interconnections connecting various outputs of the delay line to various inputs of the dual-input latches.

Delay line 500 includes a series of inverters 501–510. The input to delay line 500 is input signal IN. In the delay line, every two inverters an output signal is extracted, generating delayed input signals delay1–delay5. Delayed input signals delay1–delay5 are sequentially delayed versions of each other, as shown in FIG. 5B.

The delay Td1 between input signal IN and the first delayed input signal delay1 is controlled by the design (e.g., sizing) of inverters 501 and 502. The delay Td2 between delayed input signals delay1 and delay2 is controlled by the design of inverters 503 and 504. In the pictured example, minimally sized inverters are used to implement inverters 503–510. Thus, the delay between each pair of delayed input signals is about the same (i.e., Td2), depending on signal loading. Inverters 501 and 502 can be independently sized to ensure that the IN signal arrives before the first LE signal goes high. However, any of these delays can be controlled by the designer to move the edges of the delayed input signals, as desired.

Figure 5B:
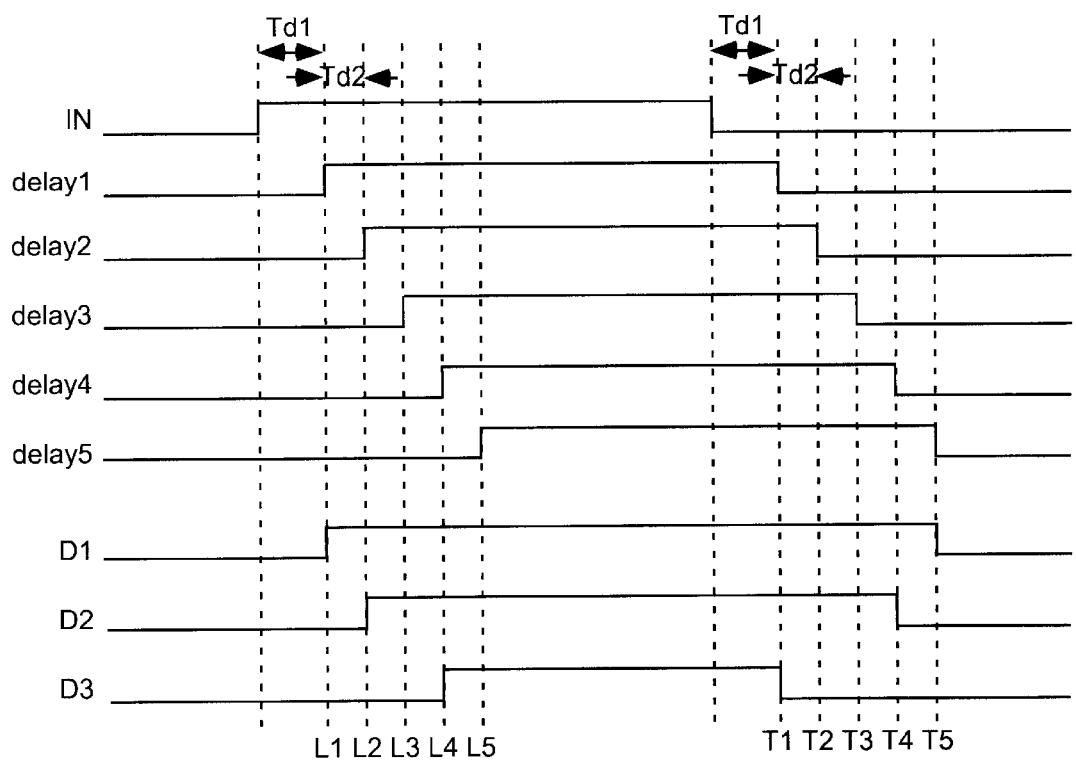
FIG. 5B is a timing diagram for the sequencer circuit of FIG. 5A.

In the embodiment of FIG. 5A, the pulses are high pulses, as shown in FIG. 5B. Therefore, the NAND gate implementation of FIG. 4A is used for the dual-input latches. However, other dual-input latches can be used in the various sequencer circuits shown herein, including the NOR gate implementation of FIG. 4B (for low pulses), and other dual-input latches designed for use with high and low pulses. The use of latch 400 is purely exemplary, and is not intended to imply that the circuits and methods of the invention are limited to using this particular latch.

FIG. 5B shows the order of the edges on the output signals D1–D3 for the sequencer circuit of FIG. 5A. Clearly, the selection of the delayed input signals delay1–delay5 to provide the LE and TE inputs for each latch determines the order of the output edges. For example, note that output signal D1 has a rising edge at time L1, because signal delay1 supplies the LE input to latch 400a. Similarly, the falling edge of signal D1 occurs at time T5, because signal delay5 supplies the TE input to latch 400a.

This simplicity of cause and effect provides a significant advantage compared to known sequencer circuits. The order of the edges of the various output signals can be altered very easily, simply by selecting different delayed input signals to drive the latches. This easy of alteration can provide a significant savings in design time compared to known sequencer circuits, which often require careful redesign and resimulation when the sequence of the output signals is altered.

FIG. 6 shows a more generalized block diagram of a sequencer circuit according to another embodiment of the invention. A triggering input signal IN is provided to a delay line 601, which provides a sequence of delayed input signals DLY1, DLY2, . . . , DLYn. Delay line 601 can be implemented as a series of inverters, as in delay line 500 of FIG. 5A, or any other delay line implementation can be used. Interconnect block 602 provides various ones of the delayed input signals to dual-input latches 603a, 603b, . . . , 603n. Dual-input latches 603a–603n are also driven by input signal IN. The dual-input latches function as shown in FIG. 4C and described above. Each dual-input latch provides an output signal OUT1, OUT2, . . . , OUTn having a leading edge determined by a first one of the delayed output signals and a trailing edge determined by a second one of the delayed output signals.

Figure 6A:
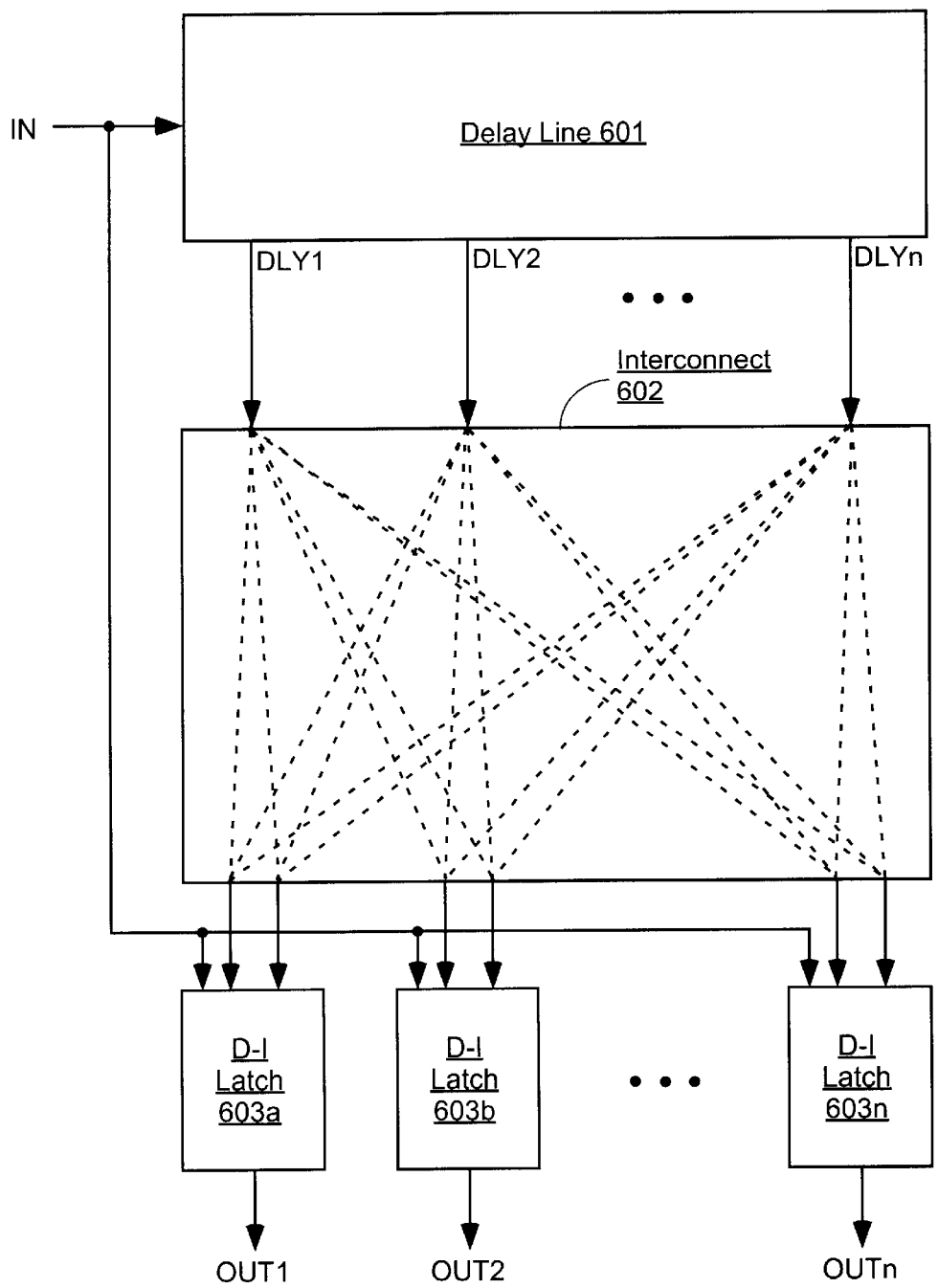
FIG. 6A is a block diagram of a generalized digital sequencer circuit according to one embodiment of the invention.
Figure 6B:
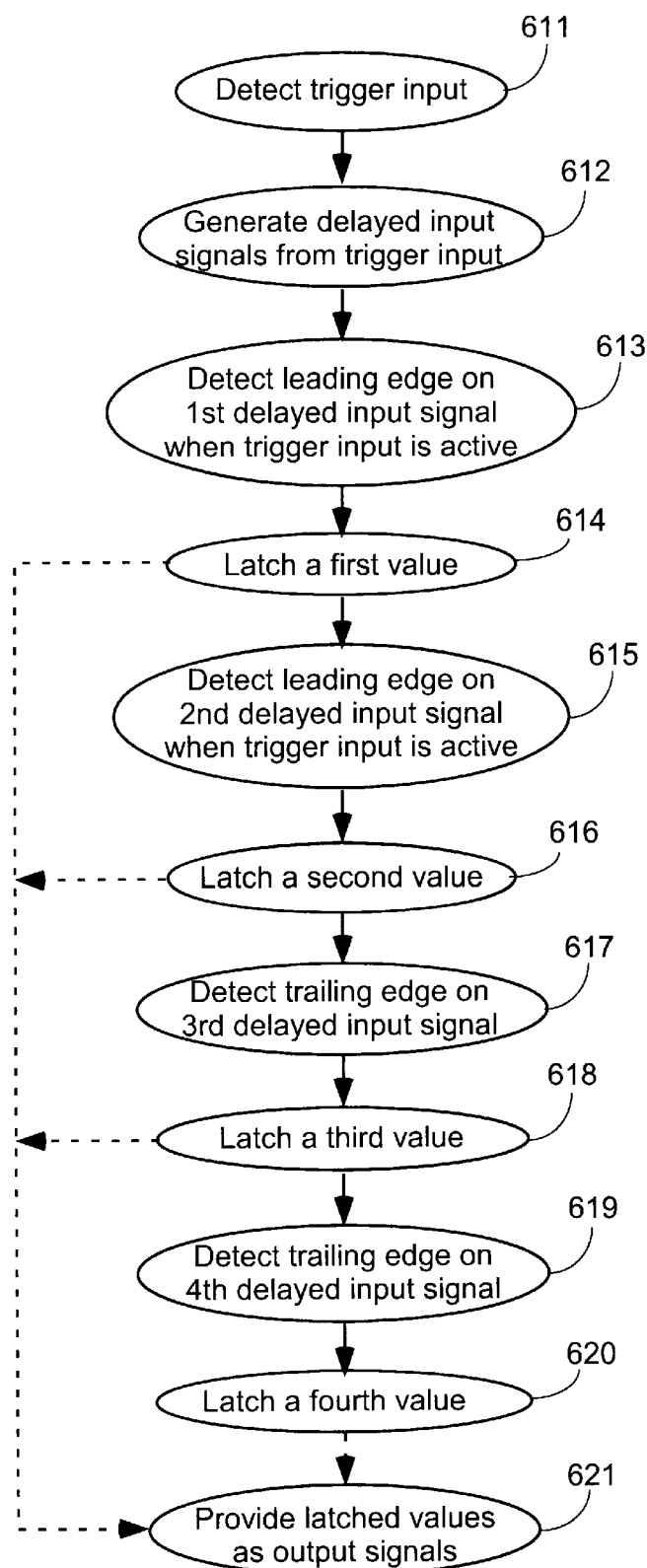
FIG. 6B is a first flow chart demonstrating the functions performed by the sequencer circuit of the invention.

FIG. 6B is a flow diagram showing a sequence of steps performed by the sequencer circuit of FIG. 6a, for example, as implemented in FIG. 5A. In step 611, a trigger input signal (e.g., IN) is detected. In step 612, a series of delayed input signals (e.g., delay1, delay2 . . . ) is generated from the trigger input signal. In step 613, a leading edge is detected on a first one of the delayed input signals (e.g., delay1) while the trigger input signal is active. In response, a first value is latched (step 614), e.g., into dual-input latch 400a. In step 615, a leading edge is detected on a second one of the delayed input signals (e.g., delay2) while the trigger input signal is active. In response, a second value is latched (step 616), e.g., into dual-input latch 400b.

In step 617, a trailing edge is detected on a third one of the delayed input signals (e.g., delay4). In response, a third value is latched (step 618), e.g., into dual-input latch 400a. In step 619, a trailing edge is detected on a fourth one of the delayed input signals (e.g., delay5). In response, a fourth value is latched (step 620), e.g., into dual-input latch 400b.

Also, and concurrently with many of the above steps, the latched values are provided as the output signals of the sequencer circuit (step 621).

Figure 6C:
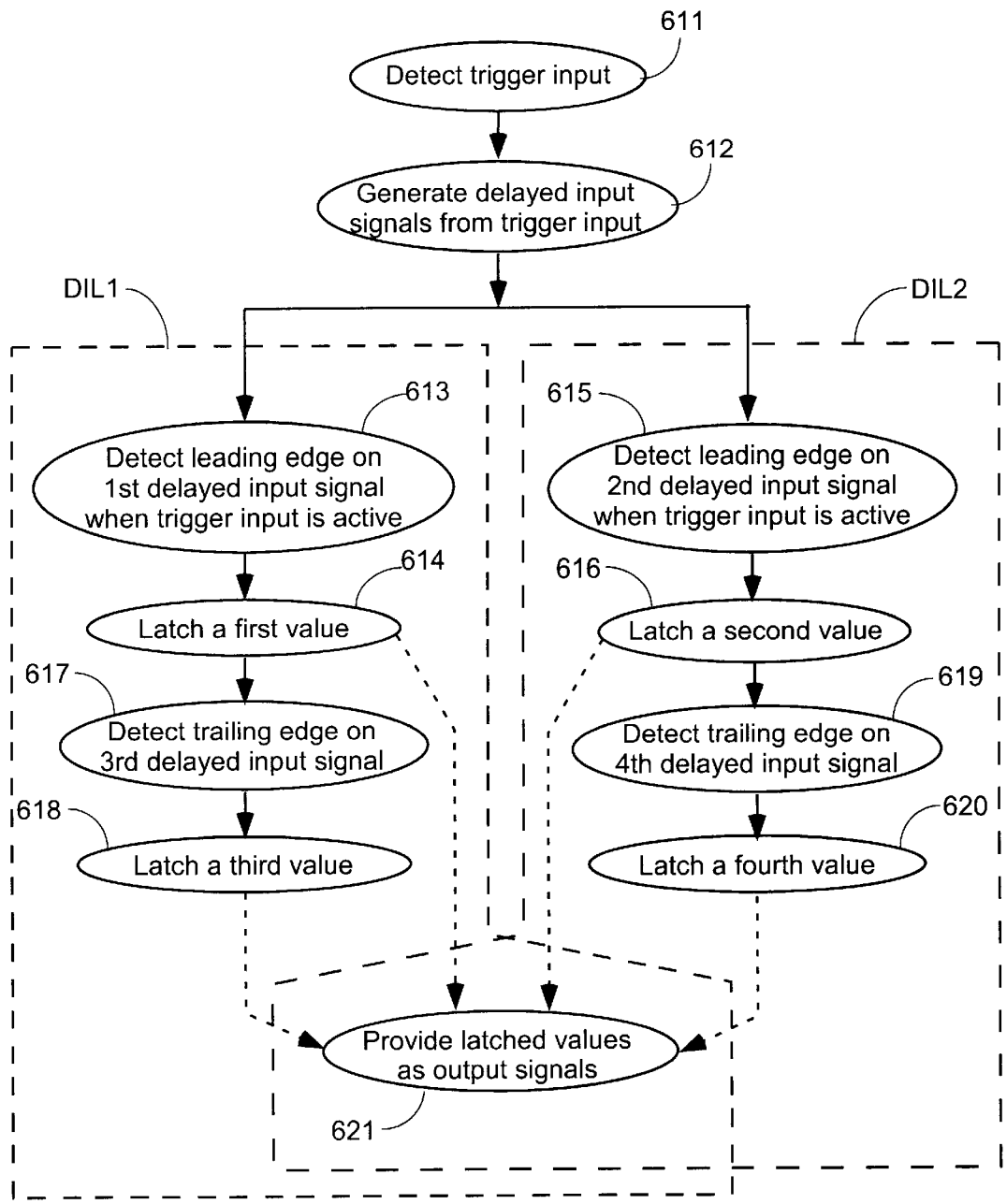
FIG. 6C is a second flow chart demonstrating the functions performed by the sequencer circuit of the invention.

The steps shown in FIG. 6B can occur in many different sequences, thereby providing a great deal of flexibility. For example, FIG. 6C shows the same series of steps as in FIG. 6B, performed in a different order. In the embodiment of FIG. 6C, steps 613–614, 617–618, and 621 (designated DIL1) are performed by a first dual-input latch, while steps 615–616 and 619–621 (designated DIL2) are performed by a second dual-input latch. Thus, steps 613–614 and 617–618 can be performed concurrently with, or in an overlapping manner with respect to, steps 615–616 and 619–620.

Further, the first, second, third, and fourth delayed input signals can be selected from any of the sequentially delayed signals provided by the delay line. Also, two or more of the first, second, third, and fourth delayed input signals can be the same signal.

Note that FIG. 5A provides only one implementation of the generalized sequencer circuit shown in FIG. 6A. Many other sequencer circuits can be implemented using the block diagram of FIG. 6A. They may have, for example: differently implemented delay lines; different numbers of delays in the delay line; varying numbers of delayed input signals provided by the delay line; varying delays between the delayed input signals; varying numbers of dual-input latches; differently implemented dual-input latches; dual-input latches responding to low pulses rather than high pulses; and different interconnections between the delayed input signals and the inputs to the dual-input latches. These and other variations are encompassed by the invention.

Another variation of the novel sequencer circuit provides a programmable interconnect block. This embodiment is particularly applicable to programmable logic devices (PLDs), where the programmable nature of the interconnect block allows a designer to modify the sequence of edges on the output signals simply by reconfiguring the PLD. For example, the programmable sequencer circuit of FIG. 7 can be used in a CPLD device, where the functionality of the sequencer circuit can be changed by reprogramming the EEPROM cells that configure the device.

Figure 7:
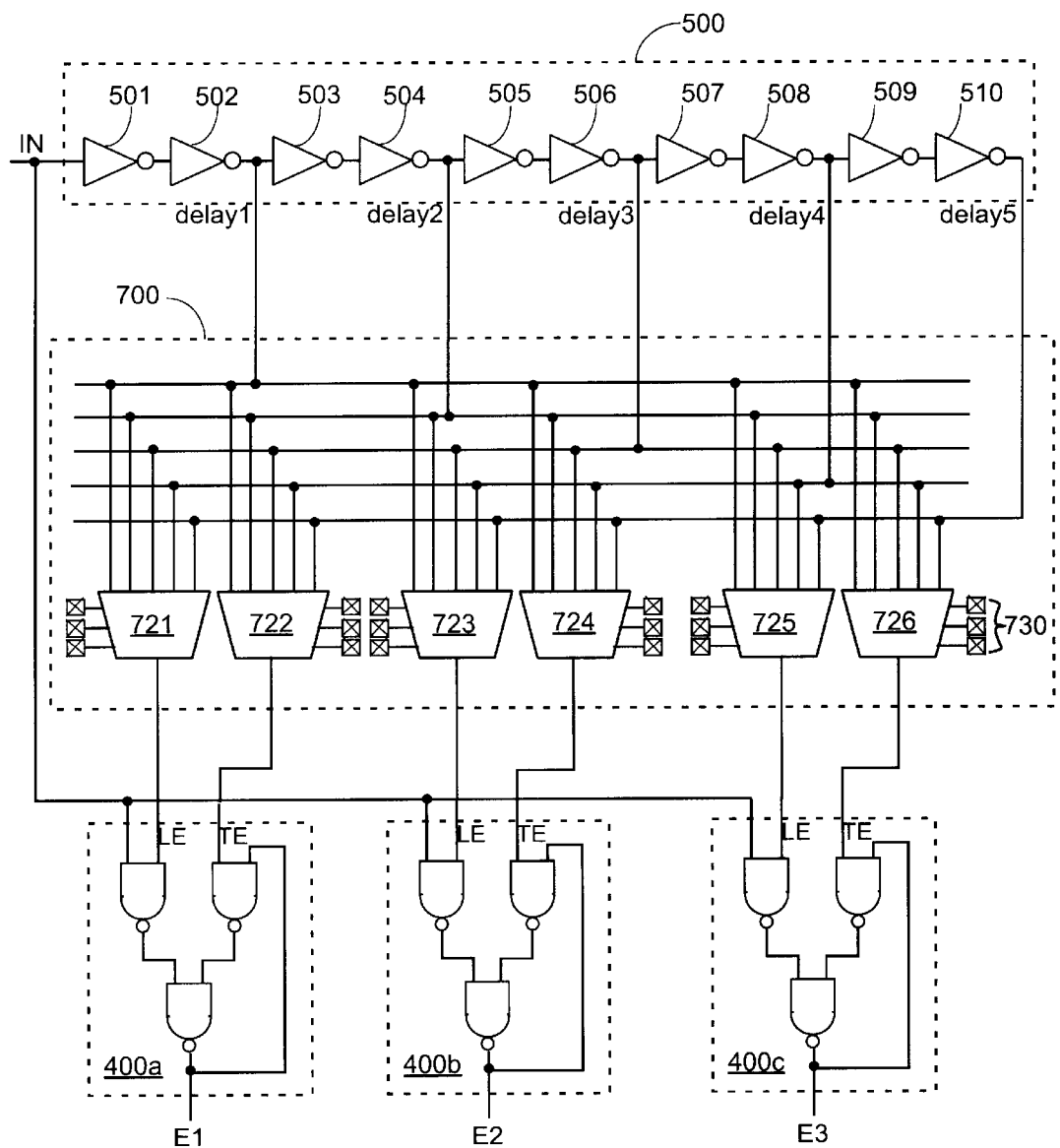
FIG. 7 is a block diagram of a programmable sequencer circuit according to one embodiment of the invention.

FIG. 7 shows a sequencer circuit having a programmable interconnect block. The pictured embodiment is similar to that of FIG. 5A, except for the programmable interconnection block. Therefore, only the interconnection block 700 is described here. Appropriately programmed, the circuit of FIG. 7 can be used to implement the sequencer circuit of FIG. 5A.

Each dual-input latch requires two delayed input signals, a leading edge signal LE and a trailing edge signal TE. Each of these signals LE, TE is provided by a multiplexer 721–726. The multiplexer is controlled by one or more select signals. In this embodiment, the select signals are stored in programmable memory cells 730. (The programmable memory cells are shown in FIG. 7 as boxes containing an "X".) Each multiplexer 721–726 selects among the available delayed input signals to provide the desired signals to the input terminals of each dual-input latch 400a–400c.

The various embodiments of the invention provide many advantages not found in prior art circuits. For example, being digital, the circuits of the invention are easy to simulate. Changes to the sequencer circuits or to the circuits driven by the sequencer circuits do not necessitate extensive resimulation. Any order of the output signals can be achieved. The amount of delay between edges on the output signals is easily controlled by increasing or decreasing a number of delays on the delay line, i.e., selecting different delayed input signals. The order of the output signal edges does not vary with power supply, temperature, or process variations. The circuits are technology independent, i.e., easily moved from process to process.

Those having skill in the relevant arts of the invention will now perceive additional modifications and additions that may be made as a result of the disclosure herein. For example, the above text describes the circuit of the invention in the context of ICs including programmable logic devices. However, the invention can also be applied to other systems and other ICs. Further, delay lines, inverters, NAND gates, NOR gates, dual-input latches, interconnection blocks, multiplexers, and memory cells other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Accordingly, all such modifications and additions are deemed to be within the scope of the invention, which is to be limited only by the appended claims and their equivalents.

What is claimed is:

1. A sequencer circuit, comprising:
    a triggering input terminal providing a triggering input signal;
    a first sequencer output terminal providing a first sequencer output signal derived from the triggering input signal;
    a second sequencer output terminal providing a second sequencer output signal derived from the triggering input signal;
    a first dual-input latch having a first input terminal on which only leading edges are detected, a second input terminal on which only trailing edges are detected, a third input terminal coupled to the triggering input terminal, and an output terminal coupled to the first sequencer output terminal;
    a second dual-input latch having a first input terminal on which only leading edges are detected, a second input terminal on which only trailing edges are detected, a third input terminal coupled to the triggering input terminal, and an output terminal coupled to the second sequencer output terminal;
    a delay line having an input terminal coupled to the triggering input terminal and a plurality of output terminals providing signals delayed from the triggering input signal; and
    a plurality of interconnections coupling each of the first and second input terminals of the first and second dual-input latches to one of the output terminals of the delay line.

2. The sequencer circuit of claim 1, wherein the plurality of interconnect lines is programmable.

3. The sequencer circuit of claim 2, wherein:

the sequencer circuit forms a portion of a programmable logic device; and the plurality of interconnect lines is controlled by values stored in configuration memory cells of the programmable logic device.

4. The sequencer circuit of claim 3, wherein the programmable logic device is a CPLD.

5. The sequencer circuit of claim 1, wherein:

the sequencer circuit forms a portion of an integrated circuit; and the first and second sequencer output signals are used to control a power up sequence for the integrated circuit.

6. The sequencer circuit of claim 5, wherein the integrated circuit is a programmable logic device.

7. The sequencer circuit of claim 1, wherein the delay line comprises a plurality of inverters coupled in series, and the output terminals of the delay line are coupled to output terminals of different ones of the inverters.

8. The sequencer circuit of claim 1, wherein the leading edges are rising edges and the trailing edges are falling edges.

9. The sequencer circuit of claim 8, wherein the first dual-input latch comprises:

a first NAND gate having first and second input terminals and an output terminal coupled to the output terminal of the first dual-input latch;

a second NAND gate having a first input terminal coupled to the second input terminal of the first dual-input latch, a second input terminal coupled to the output terminal of the first NAND gate, and an output terminal coupled to the first input terminal of the first NAND gate; and a third NAND gate having a first input terminal coupled to the first input terminal of the first dual-input latch, a second input terminal coupled to the third input terminal of the first dual-input latch, and an output terminal coupled to the second input terminal of the first NAND gate.

10. The sequencer circuit of claim 1, wherein the leading edges are falling edges and the trailing edges are rising edges.

11. The sequencer circuit of claim 10, wherein the first dual-input latch comprises:

a first NOR gate having first and second input terminals and an output terminal coupled to the output terminal of the second dual-input latch;

a second NOR gate having a first input terminal coupled to the second input terminal of the second dual-input latch, a second input terminal coupled to the output terminal of the first NOR gate, and an output terminal coupled to the first input terminal of the first NOR gate; and a third NOR gate having a first input terminal coupled to the first input terminal of the second dual-input latch, a second input terminal coupled to the third input terminal of the second dual-input latch, and an output terminal coupled to the second input terminal of the first NOR gate.

12. The sequencer circuit of claim 1, further comprising:

a third sequencer output terminal providing a third sequencer output signal derived from the triggering input signal; and a third dual-input latch having a first input terminal on which only leading edges are detected, a second input terminal on which only trailing edges are detected, a third input terminal coupled to the triggering input terminal, and an output terminal coupled to the third sequencer output terminal, and wherein the plurality of interconnections further couples each of the first and second input terminals of the third dual-input latch to one of the output terminals of the delay line.

13. The sequencer circuit of claim 1, wherein the plurality of interconnections couple each of the first and second input terminals of the first and second dual-input latches to different ones of the output terminals of the delay line.

14. A method for generating output signals in a predefined sequence, the method comprising:

detecting a triggering input signal;

generating a plurality of delayed input signals by delaying the triggering input signal by differing delays;

detecting a leading edge on a first delayed input signal when the triggering input signal is in a first state;

latching a first value in response to detecting the leading edge on the first delayed input signal;

detecting a leading edge on a second delayed input signal when the triggering input signal is in the first state;

latching a second value in response to detecting the leading edge on the second delayed input signal;

detecting a trailing edge on a third delayed input signal;

latching a third value in response to detecting the trailing edge on the third delayed input signal;

detecting a trailing edge on a fourth delayed input signal;

latching a fourth value in response to detecting the trailing edge on the fourth delayed input signal; and providing the latched values as the output signals.

15. The method of claim 14, wherein the first, second, third, and fourth delayed input signals are all different signals.

16. The method of claim 14, wherein detecting a leading edge on a first delayed input signal, latching a first value, detecting a leading edge on a second delayed input signal, latching a second value, detecting a trailing edge on a third delayed input signal, latching a third value, detecting a trailing edge on a fourth delayed input signal, and latching a fourth value occur in the order specified in claim 14.

17. The method of claim 14, further comprising:

programmably selecting the first, second, third, and fourth delayed input signals from the plurality of delayed input signals.

18. The method of claim 14, further comprising:

using the output signals to control a power up sequence for an integrated circuit.

19. The method of claim 14, further comprising:

detecting a leading edge on a fifth delayed input signal when the triggering input signal is in the first state;

latching a fifth value in response to detecting the leading edge on the fifth delayed input signal;

detecting a trailing edge on a sixth delayed input signal; and latching a sixth value in response to detecting the trailing edge on the sixth delayed input signal.

20. The method of claim 14, wherein the leading edges are rising edges and the trailing edges are falling edges.

21. The method of claim 14, wherein the leading edges are falling edges and the trailing edges are rising edges.

22. A dual-input latch, comprising:

a first input terminal providing a triggering input signal;

a second input terminal providing a leading edge input signal;

means for detecting a leading edge on the leading edge input signal when the triggering input signal is in a predefined state;

a third input terminal providing a trailing edge input signal;

means for detecting a trailing edge on the trailing edge input signal;

means for latching a first value when the means for detecting a leading edge detects a leading edge, and a second value when the means for detecting a trailing edge detects a trailing edge; and an output terminal providing a value latched by the means for latching.

23. The dual-input latch of claim 22, wherein the leading edge is a rising edge and the trailing edge is a falling edge.

24. The dual-input latch of claim 23, wherein:

the means for detecting a leading edge on the leading edge input signal comprises a first NAND gate having input terminals coupled to the first and second input terminals of the dual-input latch;

the means for detecting a trailing edge on the trailing edge input signal comprises a second NAND gate having a first input terminal coupled to the third input terminal of the dual-input latch; and the means for latching comprises a third NAND gate having input terminals coupled to output terminals of the first and second NAND gates, the third NAND gate further having an output terminal coupled to a second input terminal of the second NAND gate and further coupled to the output terminal of the dual-input latch.

25. The dual-input latch of claim 22, wherein the leading edge is a falling edge and the trailing edge is a rising edge.

26. The dual-input latch of claim 25, wherein:

the means for detecting a leading edge on the leading edge input signal comprises a first NOR gate having input terminals coupled to the first and second input terminals of the dual-input latch;

the means for detecting a trailing edge on the trailing edge input signal comprises a second NOR gate having a first input terminal coupled to the third input terminal of the dual-input latch; and the means for latching comprises a third NOR gate having input terminals coupled to output terminals of the first and second NOR gates, the third NOR gate further having an output terminal coupled to a second input terminal of the second NOR gate and further coupled to the output terminal of the dual-input latch.

27. A method for detecting edges on first and second input signals, comprising:

detecting a leading edge on the first input signal when the triggering input signal is in a first state;

latching a first value in response to detecting the leading edge;

detecting a trailing edge on the second input signal; and latching a second value in response to detecting the trailing edge.

28. The method of claim 27, further comprising ignoring a leading edge on the first input signal when the triggering input signal is in a second state.

29. The method of claim 27, wherein the leading edge is a rising edge and the trailing edge is a falling edge.

30. The method of claim 27, wherein the leading edge is a falling edge and the trailing edge is a rising edge.

* * * * *